United States Patent [19]
deRonde

[11] Patent Number: 4,577,054
[45] Date of Patent: Mar. 18, 1986

[54] CONNECTING COAXIAL CABLES TO SHIELDED ELECTRONIC DEVICE

[75] Inventor: Henry M. deRonde, Lomita, Calif.

[73] Assignee: The United States of America as represented by the Secretary of the Air Force, Washington, D.C.

[21] Appl. No.: 569,640

[22] Filed: Jan. 10, 1984

[51] Int. Cl.[4] .................................................. H05K 9/00
[52] U.S. Cl. ................................. 174/35 C; 174/65 R; 29/860
[58] Field of Search ................ 174/35 R, 35 C, 65 R, 174/75 C; 285/161; 339/177 R, 130 C; 219/10.55 D, 10.55 F, 10.55 M; 361/424; 333/254, 260; 29/825, 860

[56] References Cited

U.S. PATENT DOCUMENTS

| | | | |
|---|---|---|---|
| 1,170,959 | 2/1916 | Campbell | 339/130 C |
| 2,490,596 | 12/1949 | Morris | 174/35 |
| 2,678,963 | 5/1954 | Everhart | 174/48 |
| 3,001,169 | 9/1961 | Blonder | 339/177 |
| 3,155,930 | 11/1964 | Lovejoy | 333/97 |
| 3,439,303 | 4/1969 | Purzycki | 174/35 C |
| 3,671,922 | 6/1972 | Zerlin et al. | 339/74 R |
| 3,678,444 | 7/1972 | Stevens et al. | 339/130 C |
| 3,683,320 | 8/1972 | Woods et al. | 339/130 C X |
| 3,784,730 | 1/1974 | Bannies | 285/161 X |
| 4,273,407 | 6/1981 | Snuffer et al. | 339/177 R |
| 4,469,390 | 9/1984 | Le Vine et al. | 339/177 R X |

FOREIGN PATENT DOCUMENTS 1603523 11/1981 United Kingdom ............. 174/65 R

Primary Examiner—A. T. Grimley
Assistant Examiner—D. A. Tone
Attorney, Agent, or Firm—Donald J. Singer; Stanton E. Collier

[57] ABSTRACT

A coaxial cable feed thru reduces the required cable trough width to about 0.400 inches. A feed thru body has a flange and a threaded tube for holding the coaxial cable as it passes without electrical interruption from the trough to a shielded RF device. A nut is placed on the threaded tube which is inserted through a slot in the trough wall. The feed thru flange is compressed against the wall closing the slot when the nut on the opposite side of the wall has been torqued.

4 Claims, 5 Drawing Figures

CONNECTING COAXIAL CABLES TO SHIELDED ELECTRONIC DEVICE

STATEMENT OF GOVERNMENT INTEREST

The invention described herein may be manufactured and used by or for the Government for governmental purposes without the payment of any royalty thereon.

BACKGROUND OF THE INVENTION

This invention relates generally to means of connecting electronic devices, and, in particularly relates to means of connecting coaxial cables to shielded electronic devices where the cable trough is very narrow.

When RF signals have to be interconnected between circuits located in distant shielded cavities, a fifty ohm stripline substrate cannot be utilized because of signal attenuation due to the distance involved.

One method of interconnecting these circuits uses semirigid coaxial cables. If one uses conventional connectors excessive room and weight are required. This is a major drawback when these interconnections are used in satellites where one wants to minimize needless weight and space.

In the past, if one used conventional RF connectors between shielded cavities, a cable trough having a width between 0.800 to 1.170 inches was required.

For example, the minimum trough width was obtained when the coaxial cable with an RF connector plug was connected to an RF swept right angle flange mount jack receptacle that was mounted on the shielded cavity wall. Because the receptacle mounting holes cannot be tapped in the vertical cavity wall, a stainless steel back-up plate with tapped holes has to be employed. The cavity wall must be recessed to allow the back-up plate to be flush mounted with the inside cavity wall. The four screw clearance holes and the hole for the receptacle center contact were machined in the cavity wall by electron discharge.

Further, installing or removing the coaxial cable requires temporarily deforming of the cable.

In the past, the minimum trough width obtainable with this method was 0.800 inches. These drawbacks have motivated a search for a connecting means to minimize the problems noted above.

SUMMARY OF THE INVENTION

The present invention sets forth a coaxial feed thru that overcomes the problems set forth hereinabove. A coaxial feed thru consisting of a feed thru body having a rectangular flange with a threaded coupling through which a coaxial cable is inserted and soldered. On the flange side, the cable is terminated in such a manner that the outer jacket and the dielectric material of the cable are flush with the flange. The cable center conductor protrudes a short distance beyond the flange for the purpose of connecting a ribbon or wire circuit element.

On the coupling side the coaxial cable, utilizing a minimum allowable bend radius, is bent in the direction where the other end of the cable is terminated in the trough. This termination may be another coaxial feed thru or an input/output RF connector.

The coaxial feed thru is installed by sliding the coupling into a machined slot in the shielded cavity wall. The flange is placed on the inside of the cavity and a nut, which was placed on the cable prior to soldering, is threaded on the coupling for securing the coaxial feed thru to the cavity wall. In this manner the trough width does not exceed 0.400 inches.

One object of the present invention is a coaxial feed thru that minimizes trough width.

Another object of this invention is a coaxial feed thru that substantially reduces machining cost.

Another object of this invention is a coaxial feed thru that does not break the cable with a connector.

Another object of this inventon is to install and/or remove interconnecting coaxial cables without deforming the cable or applying stresses to the cable/attachment solder joint.

These and many other objects and advantages of the present invention will be readily apparent to one skilled in the pertinent art from the following detailed description of a preferred embodiment of the invention and related drawings.

DETAILED DESCRIPTION OF THE PREFERRED EMBODIMENT

Figure 1:
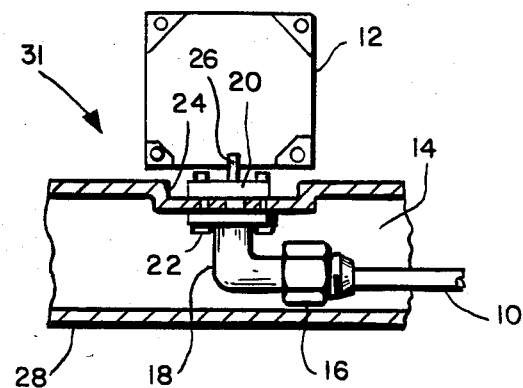
FIG. 1 is a prior art interconnector.

Referring to FIG. 1, a prior art device for coupling a coaxial cable 10 to a shielded RF device 12 is shown.

Cable 10 is placed in a trough 14 of approximate width of 0.800 inches or greater. Cable 10 is connected to a coupling 16 that is further connected to an RF swept right angle flange mount connector jack receptacle 18.

Connector jack receptacle 18 is mounted to a cavity wall 28 in a recessed area 24 by installing four mounting screws 22 through clearance holes in the flange of connector jack receptacle 18 and holes in wall 28 into the threaded holes of a back-up plate 20. A connector receptacle center pin 26 protruding into a shielded cavity 31, partially shown, is connected to device 12 by means of a wire or ribbon, not shown.

Because of the confined working space in trough 14, five holes are cut by electron discharge machining in wall 28 of trough 14. In order to withstand great vibration, back-up plate 20 has been made of stainless steel in the past.

The complexity of connecting cable 10 to device 12 is clearly evident from the above method. A coupling is required at connector receptacle 18 thus causing a break in the 50 ohm cable 10. Trough wall 28 must have recess 24 made therein. Five holes must be machined by electron discharge because of the confined working space. Back-up plate 20 must be made of strong metal to withstand vibrations. The assembly and construction of the parts are costly and time consuming.

Figure 2:
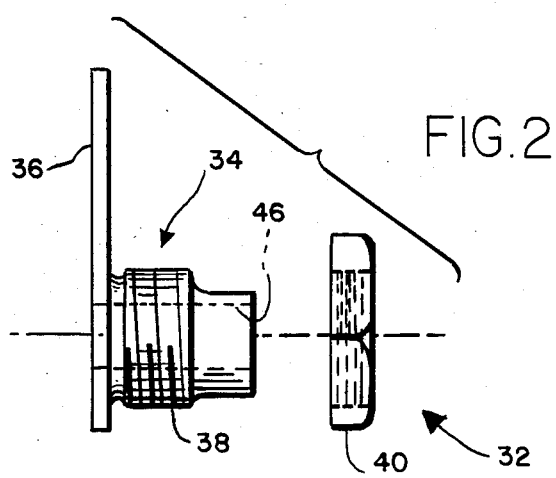
FIG. 2 is a side view of the coaxial feed thru of the present invention.

In contrast to the above, FIG. 2 illustrates a coaxial feed thru 32 that reduces the trough width to 0.400 inches and provides additional benefits and features as noted hereinafter.

Figure 3:
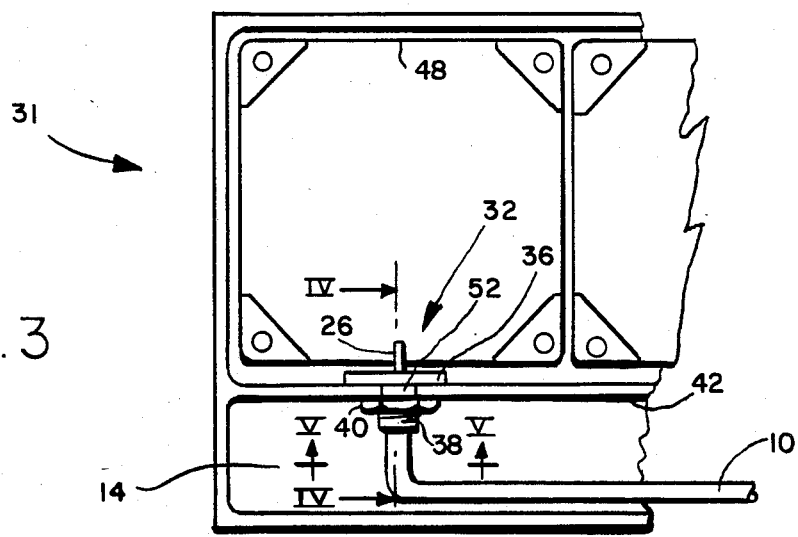
FIG. 3 is a top view of the coaxial feed thru of this invention connected to a shielded RF cavity.
Figure 4:
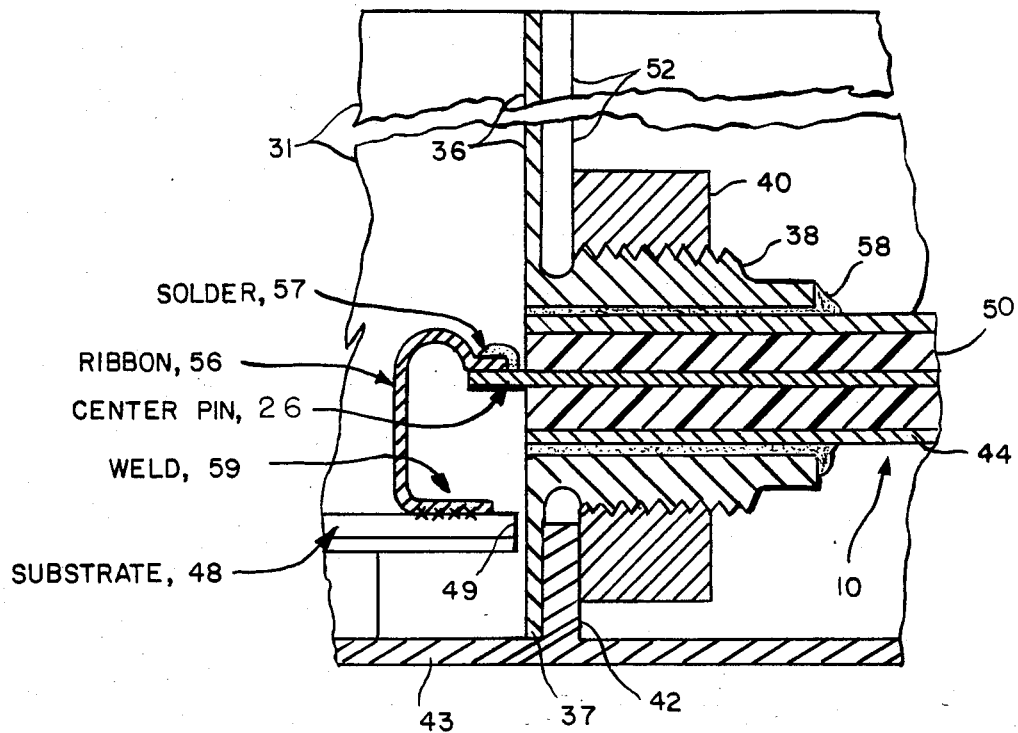
FIG. 4 is a cross section taken along lines IV—IV of FIG. 3 of the present invention.
Figure 5:
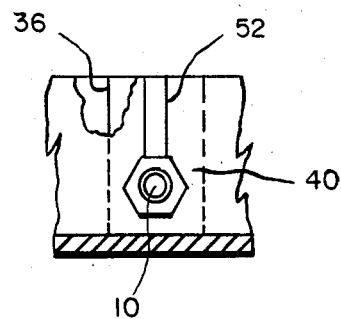
FIG. 5 is a cross section taken along lines V—V of FIG. 3 of the present invention.

FIG. 3 is a top view with cable 10 with coaxial feed thru 32 installed. FIG. 4 provides a detailed cross section of feed thru 32 installed in a shielded cavity wall 42 and FIG. 5 shows a side view of the installed feed thru 32 on the trough side of shielded cavity wall 42.

Referring to FIG. 2, feed thru body 34 has a flange 36 with threaded tube 38 attached thereon. Both flange 36 and tube 38 have a hole 46 therethrough that is of a diameter slightly larger than that of coaxial cable 10. A nut 40 is placed over coaxial cable 10. Coaxial cable 10 is then inserted through hole 46 and protrudes approximately 0.25 inches beyond flange 36. Coaxial cable 10 is then attached with solder 57 in place as shown in FIG. 4. On flange 36 side, a coaxial cable jacket 44 and dielectric material 50 are cut flush with flange 36. A coaxial cable center pin 26 is terminated at approximately 0.060 from flange 36. Coaxial cable 10 protruding on the coupling side is bent in the direction where the other end of the cable 10 is terminated. This termination may be another coaxial feed thru or an input/output RF connector, not shown. Beyond feed thru body 34 the minimum allowable bend radius for the particular coaxial cable diameter is employed.

Coaxial cable 10 with coaxial feed thru 32 attached is installed by sliding tube 38 down into a slot 52, machined in shielded cavity wall 42, until flange 36 on the inside of shielded cavity 31 touches a floor 43 of shielded cavity 31 between cavity wall 42 and side 49 of an electronic device 48. When a bottom 37 of flange 36 touches floor 43 of shielded cavity 31, the top of flange 36 is flush or slightly below the top surface of shielded cavity 31. By attaching pre-installed nut 40 on threaded tube 38, a compression force will be exerted between flange 36 and cavity wall 42. Flange 36, in this manner, closes slot 52 in the cavity wall 42 and shielded cavity 31 maintains its RF shielded integrity. Center pin 26 may be connected to electronic device 48 by soldering a wire or ribbon 56 to center pin 26 and the other end either soldered, welded or bonded to electronic device 48 by a weld 59.

Feed thru 32 has withstood vibrator testing from 20 to 25,000 Hz at 52 g's in all three axes wherein "g" is the gravitational acceleration. It has also been subjected to extensive thermal cycling and thermal shock testing and has proven itself to be reliable in all aspects.

Feed thru 32 provides numerous benefits such as but not limited to (1) no electron discharge machining, rather normal machining to make slot 52; (2) easier assembly steps such as reducing time wasted bolting conventional back-up plate 26 in place; (3) no need to change trough wall 42 shape, only slot 52 is machined in wall 42 with conventional machining method; (4) does not require a separate connector plug 16; (5) minimizes trough width to not more than 0.400 inches, 70% less than previous conventional connection; (6) requires only single nut 40 to hold feed thru 32 in place; and (7) does not require the deforming of coaxial cable 10 for installation or removal of coaxial cable 10, etc.

Clearly, many modifications and variations of the present invention are possible in light of the above teachings and it is therefore understood, that within the inventive scope of the inventive concept, the invention may be practiced otherwise than specifically claimed.

What is claimed is:

1. A combination of a coaxial cable assembly and a shielded cavity, said combination comprising:

a plurality of shielded cavity walls, said shielded cavity walls positioned about an RF electronic device therein, at least one of said shielded cavity walls having at least one vertical slot therethrough, said slot having an opening at a top of said shielded cavity wall;

a coaxial cable trough, said coaxial cable trough being adjacent to said shielded cavity wall having said vertical slot therein, said trough having a minimum width for allowing a right angle bend of a semi-rigid coaxial cable; and a coaxial cable feed thru, said coaxial cable feed thru connecting a semi-rigid coaxial cable in said trough through one of said shielded cavity walls of said shielded cavity to said RF device shielded from said trough, said feed thru further comprising:

a feed thru body, said feed thru body having a flange and a threaded tube, said flange and said threaded tube are connected fixedly together, said flange and said threaded tube having aligned holes, said holes having an inside diameter slightly greater than the outside diameter of said semi-rigid coaxial cable, said semi-rigid coaxial cable soldered into said holes, said semi-rigid coaxial cable having a center conductor that protrudes beyond a surface of said flange for the purpose of connecting a conductive ribbon thereon, said flange resting on an inside surface of said shielded cavity in which said RF device is mounted and connected, said flange covering said vertical slot on said shielded cavity wall to form an RF seal thereabout; and a nut, said nut for holding said flange against said inside surface of said shielded cavity, said nut being threaded onto said threaded tube that is inserted into said slot in said shielded cavity wall, such nut resting against an outside surface of said shielded cavity wall.

2. A feed thru as defined in claim 1 wherein said slot and said flange are rectangular shaped.

3. A feed thru as defined in claim 1 wherein said coaxial cable has a metal jacket that is soldered to said holes in said flange and in said threaded tube to form an RF seal.

4. A method of connecting shielded cavities with semi-rigid coaxial cables running in troughs of minimum width for said coaxial cables, said method comprising the steps of:

a. cutting vertical slots in shielded cavity walls;

b. cutting semi-rigid coaxial cables to a required length;

c. shape forming said coaxial cables in a predetermined manner to lay within said trough;

d. soldering feed thru bodies to said coaxial cables that are cut to length and shape formed;

e. attaching each cable with feed thru bodies thereon to said shield cavity walls having slots therein, said feed thru bodies having a flange and a threaded tube attached thereto, said threaded tube fitting closely within said vertical slots, said threaded tube with said flange thereon being held fixedly to said shielded cavity wall by a nut on said threaded tube, said flange forming an RF seal over said slot; and f. attaching said coaxial cables to said electronic device.

* * * * *